METHOD OF MAKING A PRINTED CIRCUIT AND BASE THEREFOR

Filed May 4, 1961

INVENTOR
JOHN H. MARSHALL

BY Otto Schmid, Jr.
AGENT

United States Patent Office 3,171,756

Patented Mar. 2, 1965

3,171,756

METHOD OF MAKING A PRINTED CIRCUIT AND BASE THEREFOR

John H. Marshall, Saugerties, N.Y., assignor to International Business Machines Corporation, New York, N.Y., a corporation of New York Filed May 4, 1961, Ser. No. 107,736
4 Claims. (Cl. 117—212)

This invention relates to a method of making a metallized sheet from a fibrous material in a unitary series of steps.

The invention is especially useful in the production of printed circuit boards but is not limited thereto. In modern electronic equipment, it has been found advantageous to provide printed circuit boards made up of an insulating material having electrical conductors on one or both sides. The electrical conductors have been placed upon the insulating material in a variety of ways including attaching a metallic foil to the insulating material by adhesives, spraying molten metal upon the insulating material, silk screening, embedding the conductor into the insulating material, and depositing the metal upon the insulating material by chemical means. These methods suffer from disadvantages due to varying bond strength of the electrical conductor upon the insulating material, blistering of the circuit pattern, and lack of uniformity in circuit thickness and continuity.

The technique knonw as electroless plating or plating by chemical reduction has been used for through-hole plating where circuits are formed on both top and bottom of double sided copper clad laminates, for example, by etching. In this technique the copper circuit receives the deposit as well; and in many cases this deposit is undesirable so that the circuit must be masked out before the electroless plating step, or the deposit must be removed after the electroless plating step by sanding, for example. This is especially true in instances where it is desired to electroplate copper on the clad copper since the electroless deposit remains as an interface layer with the result that adhesion of the electroplated layer is poor and delamination of the circuit is likely to result.

Accordingly, this invention is directed to a process of making an improved printed circuit board wherein both the base member and the conductors are formed in a process in the same sequence of steps.

A feature of this invention is the provision of a base member constructed from a fibrous material in which each fiber is sensitized so that a coating of metal can be deposited upon all exposed surfaces of the base member when it is placed in a chemical plating bath.

It is another feature of this invention to produce a base of sensitized fibers and then, in a further operation, to produce a metallic coating thereon by chemical means.

It is an object of this invention to provide a printed circuit board stock which lends itself more readily to through-hole plating.

It is another object of this invention to provide a printed circuit board stock which lends itself to the interconnection of a plurality of boards by means of a through-hole conductor.

It is a further object of this invention to provide a convenient method of manufacturing a printed circuit in a unitary series of steps starting from a fibrous material.

The foregoing and other objects, features and advantages of the invention will be apparent from the following more particular description of preferred embodiments of the invention, as illustrated in the accompanying drawings.

Figure 1:
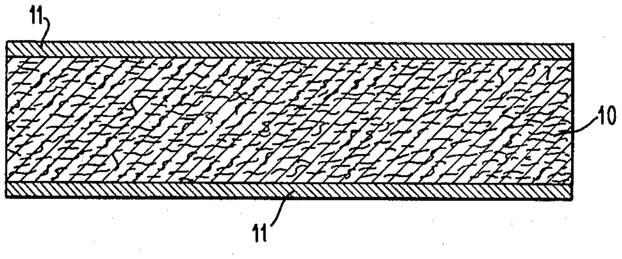
FIG. 1 is a sectional view of a double sided printed circuit board manufactured according to the invention.

In general, this invention contemplates the production of a printed circuit board by first forming an insulating base member from a sensitized fibrous material and in a further operation forming a conductive metal coating thereon by chemical or electro-chemical means.

Any suitable filamentous material which is capable of absorbing chemical ions may be used in this process. Examples are wool, synthetic fibers, glass and cellulosic material such as wood fibers and cotton; but the ultimate choice is determined by economic considerations and the dielectric properties desired for the finished circuit. The fibrous material chosen is then sensitized. The method of sensitizing the fibrous material may vary; metal salts, for example, salts of tin, palladium, copper, or gold in acidic solution, either singularly or in combination, may be used. If desired the fibers may be given a preliminary, freshening treatment. The sensitized fibers are then formed into the desired shape which may be a sheet, for example. After masking those portions on which a conductive coating is not desired, the shaped base member of sensitized fibers is then immersed in a chemical deposition bath to provide a strongly adherent conductive coating on all exposed sensitized surfaces. The composition of the chemical deposition bath is chosen to obtain the desired conductive coating; typical metals used for the coating are copper, silver and gold, which may be obtained from copper sulphat, silver nitrate, and gold chloride solutions, respectively.

A preferred embodiment of the process is given by way of example and is not intended to be limiting. The starting material is one quarter gram of washed wood fibers. These wood fibers, which comprise pulp of the type used in making tabulating cards, consist largely of semi-bleached sulphite but containing about 10% of semi-bleached sulphate pulp. The wood fibers are placed in a solution consisting of 100 cc. of 5% hydrochloric acid, 1 to 3 grams of stannous chloride and a wetting agent, preferably one of the anionic type such as Dioctyl Sodium Sulfosuccinate which is sold under the trade name of Aerosol OT, 0.025%, may be added. After this treatment, the slurry of wood fibers is then filtered and rinsed with water on a suction filter. The filtered wood fibers are then placed in a second solution consisting of 100 cc. of 0.5% hydrochloric acid with 0.015 gram of palladium chloride therein for one-half minute. This slurry of wood fibers is filtered and rinsed with water once again on a suction filter. The filtered fibers are placed in 100 cc. of water and a sheet is formed by any suitable method of papermaking. Filler and binders may be added to the fibers at this point as in any standard method of making paper. Resins may be also included at this point depending on the rigidity of the base member desired. The formed sheet is then air dried and the result is a sensitized sheet. The sheet is then immersed in a solution comprising 100 cc. water with one gram each of copper sulphate, glycerine and sodium hydroxide, to which 4 to 5 cc. of formalin (37%) are added two minutes before using. After four or five minutes in this solution, the sheet will be coated with metallic copper and the sheet is then rinsed and air dried. While the thickness of the metallic coating thus obtained is sufficient for most printed circuit applications, the thickness of the metallic deposite may be increased by electroplating if desired. The thickness of the metallic conductor depends upon the duration of exposure in the plating bath and the composition of the bath.

This method provides numerous advantages and a versatile process for obtaining a variety of printed circuit arrangements. The thickness and shape of the base member may be varied over a wide range by controlling the amount of fibers used and the method of forming the fibers into the base member. The dielectric qualities of the base member may also be controlled over a wide range by the proper choice of the starting fibrous material and the materials used to sensitize the fibers. Once the sensitized sheet is formed, a coating of metal on all exposed surfaces can be obtained by immersing the sheet in an electroless plating bath. As shown in FIG. 1 the sensitized base member 10 may be coated on each side with a conductive coating 11. Thus a board having a strongly adherent conductive coating on each side is produced without the use of adhesives. This board can then be used to produce a printed circuit by masking out the desired circuit pattern and removing the unwanted conductive material by etching, for example.

Ordinarily it would be advantageous to eliminate the etching process to obtain the desired circuit pattern, and this result can be easily accomplished by the invention by masking the sensitized base member by any suitable means before the metallic coating is applied. The metal will be deposited only upon those areas of the sensitized sheet that are exposed to the plating solution.

Another advantage of this process is that the sheet can be stored in its sensitized condition for long periods of time. When ready for use, it is only necessary to stamp or cut out a section of the sheet to the desired size, mask out the desired circuit or pattern and, in a one-step operation, immerse the assembly in a chemical solution for final deposition of the metallic conductor. Also, the sensitized base member can be reused if desired by removing the metallic conductor either wholly or in part, masking the base member and depositing another conductive pattern in the regular manner.

Figure 2:
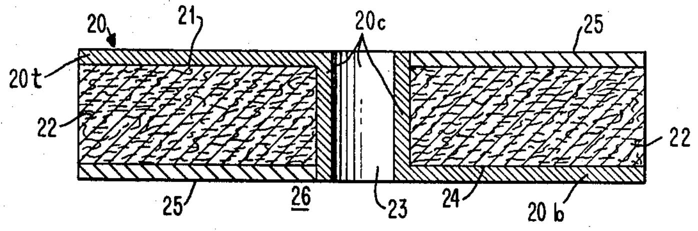
FIG. 2 is a cross section view of a circuit manufactured in accordance with the invention wherein the circuit starts on one side of the board and continues on the other side of the board with the circuits connected by a plated through-hole conductor.

Since the entire sheet is sensitized, a versatile arrangement of circuits can be made. For example, as shown in FIG. 2 a circuit conductor 20 comprising portions 20*t*, 20*c* and 20*b* can be started on one side 21 of the sheet 22, proceed through a hole 23 and continue on the other side 24 of the sheet 22.

This result is accomplished by masking the sensitized base member 22 with a suitable plating resist material 25 in any manner well known in the art. The resist material 25 must be resistant to plating and peeling when immersed in the plating bath. The masked sheet is then immersed in the plating bath as described above so that a closely adherent coating of metal is produced on all surfaces not masked.

An important feature is that this printed circuit 26 can be made in a one step operation once the base member 22 has been formed. Since every fiber of the base member 22 is sensitized the holes formed therein may be plated by material 20*c* at the same time that the conductive patterns 20*b* and 20*t* are deposited.

Figure 3:
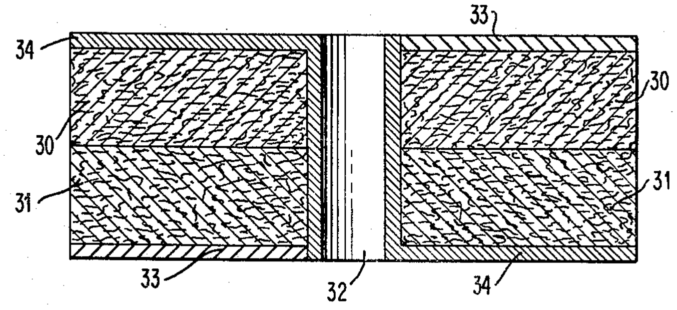
FIG. 3 is a cross section view illustrating the use of the invention to provide a plated through connector to interconnect circuits on a plurality of stacked printed circuit boards.

Likewise, a plated through hole can be used as a connector for a plurality of printed circuit sheets as shown in the example of FIG. 3 wherein two sheets 30, 31 are shown. The sheets 30, 31 are tightly stacked and a hole 32 is punched through the entire stack. All portions of the sheets 30, 31 on which a conductive coating is not desired are coated with a suitable resist material 33. The stack is then immersed in a plating bath and a metallic coating 34 is formed upon all surfaces of the sheets 30, 31 which were exposed to the plating bath.

Since the entire sheets are sensitized the hole conductor and the circuits on sheets 30, 31 are deposited simultaneously in a one step operation thereby connecting all the circuits.

An important feature of the invention is the deposition of the metallic conductor in a one-step process once the base member has been formed, since in prior art electroless plating techniques, the paper sheet would be broken up due to the strong action of the chemicals used and the length of time necessary for depositing the metal. Also, since each fiber of the base member is sensitized, the distribution of the deposited metal will be uniform.

This method will allow the formation of a continuous web of sensitized fibers and the paper made therefrom may be continuously coated on one side and rolled and used as a capacitor.

While the invention has been particularly shown and described with reference to preferred embodiments thereof, it will be understood by those skilled in the art that various changes in form and details may be made therein without departing from the spirit and scope of the invention.

I claim:

1. The method of making a printed circuit board of the type wherein conductive coatings on opposed surfaces of an insulating sheet are connected through an aperture in said sheet, comprising the steps of:

sensitizing a quantity of fibrous insulating material by thoroughly impregnating each fiber with an acidic solution of a salt of a metal selected from the group consisting of palladium, tin, copper and gold;

forming the sensitized fibrous insulating material into an insulating sheet having the property that not only the opposed surfaces of said insulating sheet but also the sides of an aperture punched in any portion thereof are sensitized to receive a conductive coating;

punching an aperture in said insulating sheet;

masking portions of said opposed surfaces of said insulating sheet so as to provide unmasked areas extending out from said aperture on each surface of said insulating sheet; and depositing a conductive coating on the unmasked areas of said opposed surfaces and on the sides of said aperture so as to form a circuit in which the portions on said opposed surfaces are connected through said aperture.

2. The method of making a printed circuit board of the type wherein conductive coatings on opposed surfaces of an insulating sheet are connected through an aperture in said sheet comprising the steps of:

sensitizing a quantity of fibrous insulating material by immersing said fibrous insulating material in a first bath containing an acidic solution of a salt of tin, then immersing said fibrous insulating material in a second bath containing an acidic solution of a salt of palladium so as to thoroughly impregnate each fiber;

forming the sensitized fibrous insulating material into an insulating sheet having the property that not only the opposed surfaces of said insulating sheet but also the sides of an aperture punched in any portion thereof are sensitized to receive a conductive coating;

punching an aperture in said insulating sheet;

masking portions of said opposed surfaces of said insulating sheet so as to provide unmasked areas extending out from said aperture on each surface of said insulating sheet; and immersing said insulating sheet in a solution containing a salt of copper so that a copper coating is deposited on the unmasked areas of said opposed surfaces, and on the sides of said aperture so as to form a circuit in which the portions on said opposed surfaces are connected through said aperture.

3. A printed circuit board made in accordance with the method of claim 1.

4. A printed circuit board made in accordance with the method of claim 2.

References Cited by the Examiner

UNITED STATES PATENTS

| | | | |
|---|---|---|---|
| 2,848,359 | 8/58 | Talmey | 117—212 |
| 3,014,818 | 12/61 | Campbell | 117—227 |

EARL M. BERGERT, *Primary Examiner.*